(12) United States Patent
Wu et al.

(10) Patent No.: US 7,577,933 B1
(45) Date of Patent: Aug. 18, 2009

(54) TIMING DRIVEN PIN ASSIGNMENT

(75) Inventors: Yi Wu, Santa Clara, CA (US); Kenan Yu, San Jose, CA (US); James G. Ballard, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 174 days.

(21) Appl. No.: 11/601,148

(22) Filed: Nov. 17, 2006

(51) Int. Cl.
*G06F 17/50* (2006.01)

(52) U.S. Cl. .............................. 716/13; 716/9; 716/10; 716/14; 716/6

(58) Field of Classification Search ..................... 716/6, 716/9, 10, 13, 14
See application file for complete search history.

(56) References Cited

U.S. PATENT DOCUMENTS

| | | | | |
|---|---|---|---|---|
| 4,613,941 A * | 9/1986 | Smith et al. ..................... 716/12 |
| 5,737,580 A * | 4/1998 | Hathaway et al. .............. 716/12 |
| 5,889,677 A * | 3/1999 | Yasuda et al. .................... 716/6 |
| 5,889,682 A * | 3/1999 | Omura et al. ................... 716/12 |
| 6,205,570 B1 * | 3/2001 | Yamashita ....................... 716/1 |
| 6,240,541 B1 * | 5/2001 | Yasuda et al. ................... 716/6 |
| 6,286,128 B1 * | 9/2001 | Pileggi et al. .................. 716/18 |
| 6,308,302 B1 * | 10/2001 | Hathaway et al. ............... 716/5 |
| 6,415,425 B1 * | 7/2002 | Chaudhary et al. ............. 716/9 |
| 6,467,074 B1 * | 10/2002 | Katsioulas et al. ............. 716/17 |
| 6,505,335 B1 * | 1/2003 | Tanaka ......................... 716/13 |
| 6,507,938 B1 * | 1/2003 | Roy-Neogi et al. ............ 716/10 |
| 6,557,145 B2 * | 4/2003 | Boyle et al. ..................... 716/2 |
| 6,629,298 B1 * | 9/2003 | Camporese et al. ............. 716/6 |
| 6,691,296 B1 * | 2/2004 | Nakayama et al. ............. 716/15 |
| 6,832,328 B2 * | 12/2004 | Kishimoto ..................... 713/503 |
| 7,155,697 B2 * | 12/2006 | Teig et al. ...................... 716/13 |
| 7,281,233 B1 * | 10/2007 | Sivasubramaniam ......... 715/15 |
| 7,503,026 B2 * | 3/2009 | Ichiryu et al. ................. 716/14 |
| 2001/0010090 A1 * | 7/2001 | Boyle et al. ..................... 716/2 |
| 2002/0104063 A1 * | 8/2002 | Chang et al. .................... 716/4 |
| 2002/0112220 A1 * | 8/2002 | Miller .......................... 716/10 |
| 2004/0111689 A1 * | 6/2004 | Kanaoka et al. .............. 716/13 |
| 2004/0117753 A1 * | 6/2004 | Kahng et al. .................. 716/12 |
| 2004/0172605 A1 * | 9/2004 | Kuge et al. ..................... 716/1 |
| 2004/0181766 A1 * | 9/2004 | Fukui et al. ................... 716/14 |
| 2005/0097491 A1 * | 5/2005 | Katayose ..................... 716/10 |
| 2005/0114821 A1 * | 5/2005 | Petunin et al. ................ 716/15 |

(Continued)

FOREIGN PATENT DOCUMENTS

JP    10056067 A  *  2/1998

OTHER PUBLICATIONS

Meixner et al., "Timing Driven Pin Assignment in a Hierarchical Design Environment", Euro ASIC '91, May 27-31, 1991, pp. 212-217.*

(Continued)

*Primary Examiner*—Phallaka Kik
(74) *Attorney, Agent, or Firm*—Osha • Liang LLP

(57) ABSTRACT

A mechanism is disclosed for determining pin assignments in an integrated circuit. More particularly, the mechanism involves accessing design information for the integrated circuit. The design information includes a floorplan that sets forth an arrangement of blocks in the integrated circuit and timing information for interconnections between the blocks. Based on the timing information, routing information is determined for the interconnections between the blocks. The routing information includes physical routes and physical pin placements for the interconnections.

20 Claims, 5 Drawing Sheets

U.S. PATENT DOCUMENTS

| | | | | |
|---|---|---|---|---|
| 2005/0120316 A1* | 6/2005 | Suaya et al. | | 716/4 |
| 2005/0172252 A1* | 8/2005 | Cheng et al. | | 716/10 |
| 2006/0136848 A1* | 6/2006 | Ichiryu et al. | | 716/1 |
| 2006/0168551 A1* | 7/2006 | Mukuno | | 716/5 |
| 2006/0190899 A1* | 8/2006 | Migatz et al. | | 716/13 |
| 2006/0294487 A1* | 12/2006 | Bittner et al. | | 716/12 |
| 2007/0204253 A1* | 8/2007 | Murakawa | | 716/11 |
| 2007/0220466 A1* | 9/2007 | Davidovic | | 716/6 |
| 2008/0066039 A1* | 3/2008 | Berry et al. | | 716/10 |

OTHER PUBLICATIONS

Albrecht et al., "Floorplan Evaluation with Timing-Driven Global Wire Planning, Pin Assignment, and Buffer/Wire Sizing", Proceedings of 7th Asia and South Pacific 15th International Conference on VLSI Design, Jan. 7-11, 2002, pp. 580-587.*

Koide et al., "Pin Assignment with Global Routing for VLSI Building Block Layout", IEEE Transactions on Computer-Aided Design of Integrated Circuits and Systems, vol. 15, No. 12, Dec. 1996, pp. 1575-1583.*

Harvatis et al., "Pin Assignment for High-Performance MCM Systems", 1996 IEEE International Symposium on Circuits and Systems, vol. 4, May 12-15, 1996, pp. 771-774.*

Her, "Pin Assignment with Timing Consideration [VLSI]", 1996 IEEE International Symposium on Circuits and Systems, vol. 4, May 12-15, 1996, pp. 695-698.*

Maidee et al., "Timing-Driven Partitioning-Based Placement for Island Style FPGAs", IEEE Transactions on Computer-Aided Design of Integrated Circuits and Systems, vol. 24, No. 3, Mar. 2005, pp. 395-406.*

Mandoiu, "Recent Advances in Multicommodity Flow Algorithms for Global Routing", Proceedings of 5th International Conference on ASIC, vol. 1, Oct. 21-24, 2003, pp. 160-165.*

Pedram et al., "Floorplanning with Pin Assignment", 1990 IEEE International Conference on Computer-Aided Design, Nov. 11-15, 1990, pp. 98-101.*

Wakabayashi et al., "Timing-Driven Pin Assignment with Improvement of Cell Placement in Standard Cell Layout", Proceedings of 1997 IEEE International Symposium on Circuits and Systems, vol. 3, Jun. 9-12, 1997, pp. 1552-1555.*

Synopsis Products: JupiterXT data sheet http://www.synopsys.com/products/jupiterxt/jupiterxt.html, 3 pages, printed on Feb. 9, 2007.

Synopsis Products: JupiterIO data sheet http://www.synopsys.com/products/jupiterIO/jupiterIO.html, 2 pages, printed on Feb. 9, 2007.

* cited by examiner

200

```
Access design information for integrated
circuit design                          202
```
↓
```
Assign wire class to each interconnect
                                        204
```
↓
```
Route interconnects, based on timing
information                             206
```

*Fig. 2*

TIMING DRIVEN PIN ASSIGNMENT

BACKGROUND

Integrated circuits (chips) comprise many different components that must have electrical connections therebetween in order to interoperate. Typically, the chip real estate is divided into different regions with each particular component being assigned a particular region of the "floorplan." For example, separate regions are reserved for a floating point unit, a memory controller, a processor core, etc. Herein, these regions are referred to as blocks. Typically, a thin channel separates the blocks.

In order for the different components to interoperate, thousands of electrical interconnections are needed between the components. Typically, the interconnections are implemented in metal layers above the chip substrate. Commercial routing tools exist to determine interconnection routes in the metal layers. Typically, the commercial router attempts to determine routes that minimize the amount of metal used.

Each of the interconnections requires a "pin assignment" associated with the component at each end of the interconnection. That is, each interconnection requires a source pin to electrically connect to the source component and a sink pin to electrically connect to the destination component. Typically, a pin assignment describes physical information such as an "x, y" location, a particular metal layer, and a physical dimension for the pin.

One technique for establishing pin assignments is to have a person input pin assignments during a floorplanning stage. Then, the commercial routing tool determines interconnection routes to connect respective source and sink pins. As previously mentioned, the router usually attempts to determine an overall solution that minimizes metal utilization.

After routes have been determined, a timing analysis is performed to determine if the interconnection routes meet timing constraints. Unfortunately, the timing analysis generally indicates that many of the interconnection routes fail to meet a timing constraint. A consequence of this timing violation is that the initial pin assignments need to be changed. However, once the pin assignments are changed, the routing and timing must be re-performed. Often, it takes many iterations of this cycle before satisfactory pin assignments are found. A consequence of this iteration is that the chip release date is delayed. In today's competitive marketplace, time to market is important to the success or failure of a chip.

As chips become more complex and compact, the consequences of pin re-assignments becomes more severe. For example, high performance microprocessors have a substantial amount of custom layout in order to achieve the highest possible performance in the smallest die size. However, pin re-assignments lead to route changes. A possible consequence of routing changes is a need to change the custom layout. Changes to the custom layout are very undesirable due to the time, difficulty, and expense. Moreover, changes to a single route could ripple to hundreds of nearby routes, especially if the track routing is dense. Because high-performance custom layouts often employ dense routing, the chance of routing changes due to a pin-reassignment is quite high.

Because of these and potentially other drawbacks, this approach does not provide wholly satisfactory results. Consequently, an improved method and system for determining pin assignments for interconnections during an integrated circuit design process is desired.

SUMMARY

In accordance with one embodiment of the present invention, there is provided a method of determining pin assignments in an integrated circuit. More particularly, an embodiment of the present invention comprises the following. The method involves accessing design information for the integrated circuit. The design information includes a floorplan that sets forth an arrangement of blocks in the integrated circuit and timing information for interconnections between the blocks. Based on the timing information, routing information is determined for the interconnections between the blocks. The routing information includes physical routes and physical pin placements for the interconnections.

Notice that because timing information is used to determine the interconnection routes, the pin placements are based on the timing information. A benefit of using timing information to determine pin placements is reduction or elimination of interconnection routes having timing violations. Accordingly, pin re-assignment and re-routing are reduced or eliminated. Therefore, fewer iterations are needed. Furthermore, the method is compatible with existing techniques for designing integrated circuits.

BRIEF DESCRIPTION OF THE DRAWINGS

FIG. 2 is a flowchart of a process of determining initial pin assignments based on timing information, in accordance with an embodiment of the present invention.

DETAILED DESCRIPTION OF EMBODIMENT(S)

Floorplan

Figure 1:
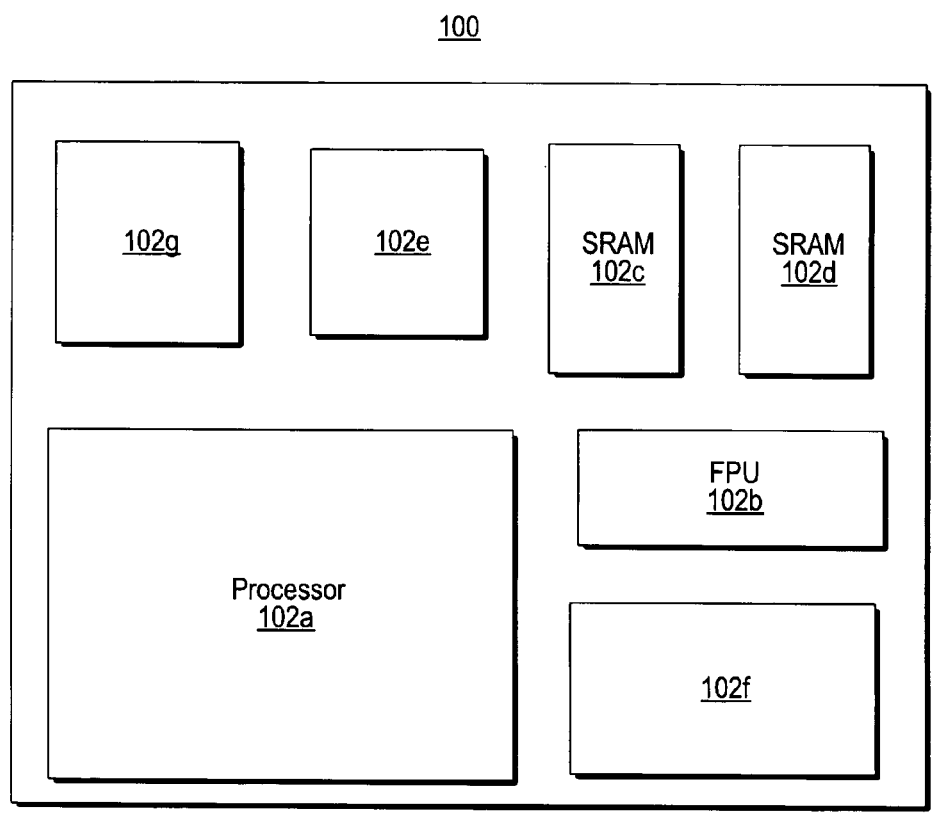
FIG. 1 is an example floorplan having blocks for which pin assignments are determined based on timing information, in accordance with an embodiment of the present invention.

FIG. 1 illustrates an example chip floorplan 100 of an integrated circuit design. The chip floorplan 100 represents the top level or chip level of a hierarchical chip design. The design of each individual block 102a-g is considered a lower level of the hierarchy. Each block 102 represents a component such as a processor 102a, a floating point unit (FPU) 102b, a memory array (e.g., SRAM 102c, 102d), etc. The chip floorplan 100 has preliminary block configurations and placements. For example, the aspect ratio of the blocks 102 (e.g., height and length), locations of blocks 102, and channel widths are specified in the chip floorplan 100.

Numerous interconnections are required between the blocks 102. For example, a communication bus might be needed between the processor 102a and a Static Random Access Memory (SRAM) 102c. The interconnections that are required can be determined based on an abstract for each block 102.

Abstracts

Typically, the design of a particular block 102 is far from complete at the floorplanning stage. However, early design information is specified in an abstract for each block 102. The design information in the abstract specifies the number of interconnections needed between each block 102. More particularity, the design information might specify that the processor 102a has "x" outputs that require source pins, and "y" inputs that require sink pins. Further information in the abstract might specify how many layers of logic the block 102 has, which affects the amount of time to get a signal in or out of the block 102. Information such as this can be used to determine pin placements, as will be discussed below.

The abstracts do not need to specify any pin placements. However, an abstract may have initial pin assignments. If the abstract has initial pin assignments, then the initial pin assignments are "un-fixed". By "un-fixed" pin placements it is meant that during a routing stage, a router is allowed to change the pin assignments.

Timing Graph

In order to determine pin assignments in a way that reduces or eliminates the need to re-assign the pin assignments, the pin assignments are determined based on a timing graph, in one embodiment. The timing graph is based on a chip level timing model and block level timing models for each block 102, in accordance with one embodiment. Each interconnection is a path between two points. Note that the route for each interconnection is determined at a later stage.

A) Chip Level Timing Model

A chip level timing model describes a relative time difference between pairs of points in the chip level design. For example, the chip level timing model describes "timing arcs" between two points in the chip level design. The two points might be registers in different blocks. For example, a timing arc might specify that signal "A" going from a register in block B to a register in block C has a "departure time" on block B of 100 ps, a time to propagate the signal (via interconnect) from a source-pin on block B to a sink-pin on block C of another 800 ps, and a "setup time" on block C of 100 ps. Each interconnection may be assigned a timing arc, which is a value that describes the total time to propagate a signal between two points (e.g., registers) on the chip.

Because actual pin locations for the interconnections are not known at the floorplanning stage, arbitrary pin locations may be selected to determine the timing arc for each interconnection. It is not required that each pin location be unique to determine the timing arcs. For example, all source pins for a given block 102 might be assigned the same location for purposes of determine timing arcs.

Between pin signal propogation time component of the timing arcs is based, at least in part on distance between pins, in one embodiment. It may be expected that interconnection routes cannot travel diagonally, but may be confined to travel in either a horizontal or a vertical direction. Therefore, the timing arcs are not necessarily based on straight line distance. Moreover, while being based on a distance, other factors can be used to determine the timing arcs. For example, the possibility that a repeater might be assigned to an interconnection to help reduce signal delay can be factored in to the timing arc.

B) Block Level Timing Model

Since the timing arc may be based on a departure time and a setup time, the block level timing model for each block 102 may comprise the "departure time" and "setup time". The "departure time" pertains to transferring a signal from within a source block 102 to a source pin. The "setup time" pertains to transferring a signal from the sink pin to a point within the destination block 102. Each interconnection is assigned a value that represents departure time and a value that represents setup time, in one embodiment.

In some cases, the design for a particular block 102 is not completely developed; however, the departure time and the setup time can still be estimated. As an example, the departure time and the setup time can be estimated based on information in a functional design of particular block 102. Even though the exact design of the logic gates for a particular block 102 are not yet known, the functional design may indicate that signal "A" goes through seven layers of logic to get from the register in block B to the source pin of block B. The departure time may be estimated from this information.

Another technique to establish departure time and the setup time is to assign each block 102 a portion of the clock cycle. For example, based on the expected frequency of the clock, the clock cycle time might be one nanosecond. Each block 102 could be assigned 10 percent of this time. Therefore, the departure time would be 100 pico-seconds and the setup time would 100 pico-seconds.

In some cases, considerable information is known about the design of the blocks 102 such that the departure time and the setup time can be estimated quite accurately. For example, the design of the particular block 102 might be complete, wherein a specification of the block 102 is available. In this case, the departure time and the setup time may be estimated quite accurately, or even taken directly, from a specification of the block 102.

Process Flow for Using Timing Information to Determine Initial Pin Assignments in an Integrated Circuit Design FIG. 2 illustrates steps of a process 200 of using timing information to determine initial pin assignments in an integrated circuit design, in accordance with an embodiment of the present invention. A timing constraint is a requirement for functional correctness of the chip. For example, to ensure the chip functions correctly, the total propagation time for signal A to go from a memory storage unit in block B to a memory storage unit in block C could be 900 ps. In this example, in view of the timing model info (1000 ps) and the timing constraint requirement (900 ps), signal A may be considered a timing critical signal that should have a higher priority when routing using timing information.

In step 202, design information for an integrated circuit is accessed. The design information includes a floorplan that sets forth an arrangement of blocks 102 in the integrated circuit. The design information also includes timing information for interconnections between the blocks 102. For example, the design information includes timing constraints and timing models.

In one embodiment, the interconnections are placed into "bins", based on the timing information. For example, if there are 1000 interconnections, then 200 interconnections that are selected as having relatively severe timing constraints, relative to the timing arc for the interconnection, are placed in a first bin. The 200 interconnections with the next most severe timing constraints are placed into a second bin, and so on. The severity of the timing constraint is determined based on a comparison of the timing constraint and the timing arc for an interconnect, in one embodiment.

In step 204, each of the interconnections is assigned a wire class. The wire class for an interconnection may include information such as the pitch (e.g., width of wire used for interconnection), a distance between an interconnection and its neighbors, and a routing layer preference. A routing layer preference specifies that the router should attempt to route the interconnection in a particular metal layer. Other possible information in the wire class includes relative location of the interconnection to certain structures, such as power sources.

The wire class assignments are based on the timing information, in one embodiment. For example, interconnections that have more critical timing constraints may be assigned a wire class having a wider pitch. As another example, timing critical interconnections may be assigned a routing layer preference of a higher metal layer. Routing an interconnection on a higher metal layer may help to reduce or eliminate timing problems involving that interconnection. Basing wire class assignments on timing information of the interconnections can help reduce or eliminate pin assignments that cause timing problems.

In step 206, the interconnections are routed, based on timing information. The routing can be performed using a commercial routing tool. An example of a commercial routing tool is the Astro™ router, which is commercially available from Synopsys, Inc. of Mountain View, Calif. In one embodiment, a set of interconnections that are more timing critical than others are routed first. For example, the router is requested to first route the interconnections in the first bin, then route the interconnections in the second bin, and so on until all interconnections have been routed.

The routing of the interconnections produces routing information that includes, for each interconnection, the physical location of the source pin and the sink pin, and a physical route between the source pin and sink pin. The physical location may include an "x, y" coordinate and a metal layer. Moreover, the router may provide physical dimensions for each pin. Therefore, pin assignments may be determined from the routing information. Pin assignments may be changed later in the design cycle. However, the need to move pin assignments is reduced or eliminated due to the use of timing information to determine the pin assignments.

In one embodiment, the router factors in repeater locations when routing the interconnections. For example, the router favors routing the interconnections that may need a repeater through "tiles" that are near repeater banks. A tile is a portion of the floorplan, such as a rectangle. Repeaters do not need to be assigned to interconnections at the routing stage.

In one embodiment, the router reserves a percentage of available tracks in each tile to accommodate later routing changes. The percentage may depend on the design of the integrated circuit. Thus, in one embodiment, a designer inputs a parameter into the router that specifies a percentage of tracks in each tile that should be reserved to accommodate later routing changes.

In one embodiment, each tile is assigned a "wire class" attribute that specifies what wire class or classes are being used for interconnections that pass through that tile. This attribute may be used later to help re-assign wire classes, as discussed below.

Figure 3:
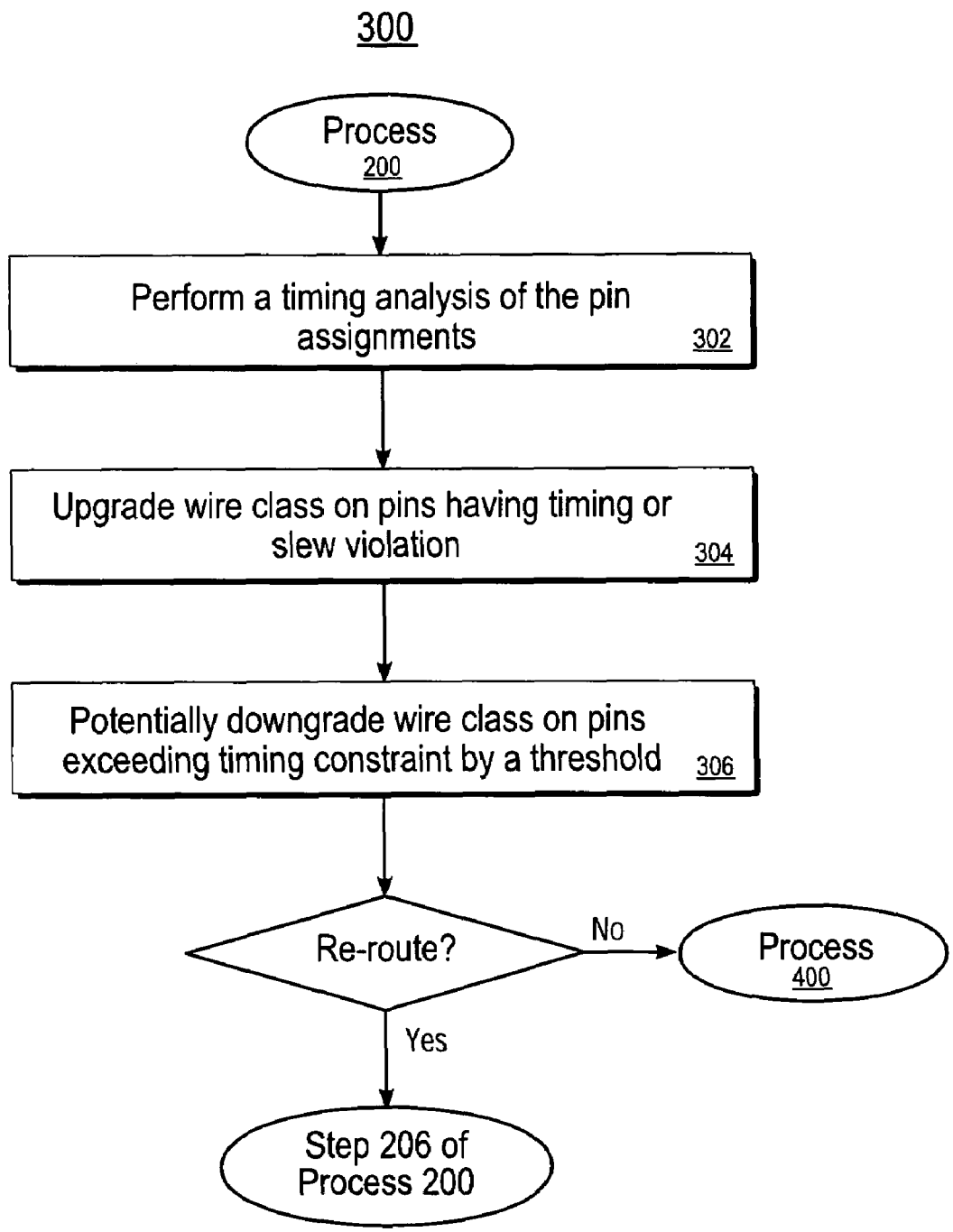
FIG. 3 is a flowchart of a process of refining pin assignments based on timing information, in accordance with an embodiment of the present invention.

Process Flow for Using Timing Information to Refine Pin Assignments in an Integrated Circuit Design FIG. 3 illustrates steps of a process 300 of using timing information to refine pin assignments in an integrated circuit design, in accordance with an embodiment of the present invention. Refining the pin assignments may be performed after determining pin assignments, as in process 200. In step 302, timing analysis of the interconnection routes is performed. The timing analysis can be based on factors such as route distance as determined by the routing information, wire class, nominal strength and output resistance of signal drivers, etc. These factors are used as examples. Other factors may be used. Repeater locations are also used in the timing analysis, in one embodiment. However, specific repeaters do not need to be assigned to interconnections at this stage. In other words, when performing timing analysis, it may be assumed that an interconnection will have a repeater at an approximate location, even if a particular repeater has not actually been assigned to an interconnection.

Any interconnections that have timing violations are identified in step 304. Timing violations may pertain to any property involving time. Thus, a slew rate violation is considered to be a timing violation. A wire class upgrade is provided for these interconnections, if possible, in one embodiment. For example, the pitch of the wire class can be increased. Another wire class upgrade is to change the routing layer preference from a lower metal layer to a higher metal layer. Note that if the router later changes the route to a different metal layer that the pin assignment will typically change such that the pin provides access to the new metal layer.

Any interconnections that exceed timing constraints by a given threshold are identified in step 306. To make this determination a timing constraint for each particular interconnect may be compared to the timing arc for the particular interconnect. These interconnections are candidates for wire class reduction. Thus, a wire with a smaller pitch might be used, or the routing layer preference might be changed to a lower metal layer. The wire classes are changed by changing the wire class attribute, in one embodiment.

After changing any of the wire classes, step 206 of process 200 is repeated to determine routing based on the new wire classes. Then, one or more steps of process 300 may be repeated. For example, timing analysis may be re-performed to determine if the timing violation has been remedied for interconnections that had violations. Also, timing analysis may be re-performed to verify that no timing violation has been created for interconnections that previously exceeded timing constraints.

If there are no changes to wire classes in either step 304 or 306, then re-routing does not need to be performed. In this case, process 400 of FIG. 4, discussed below, may be performed.

Figure 4:
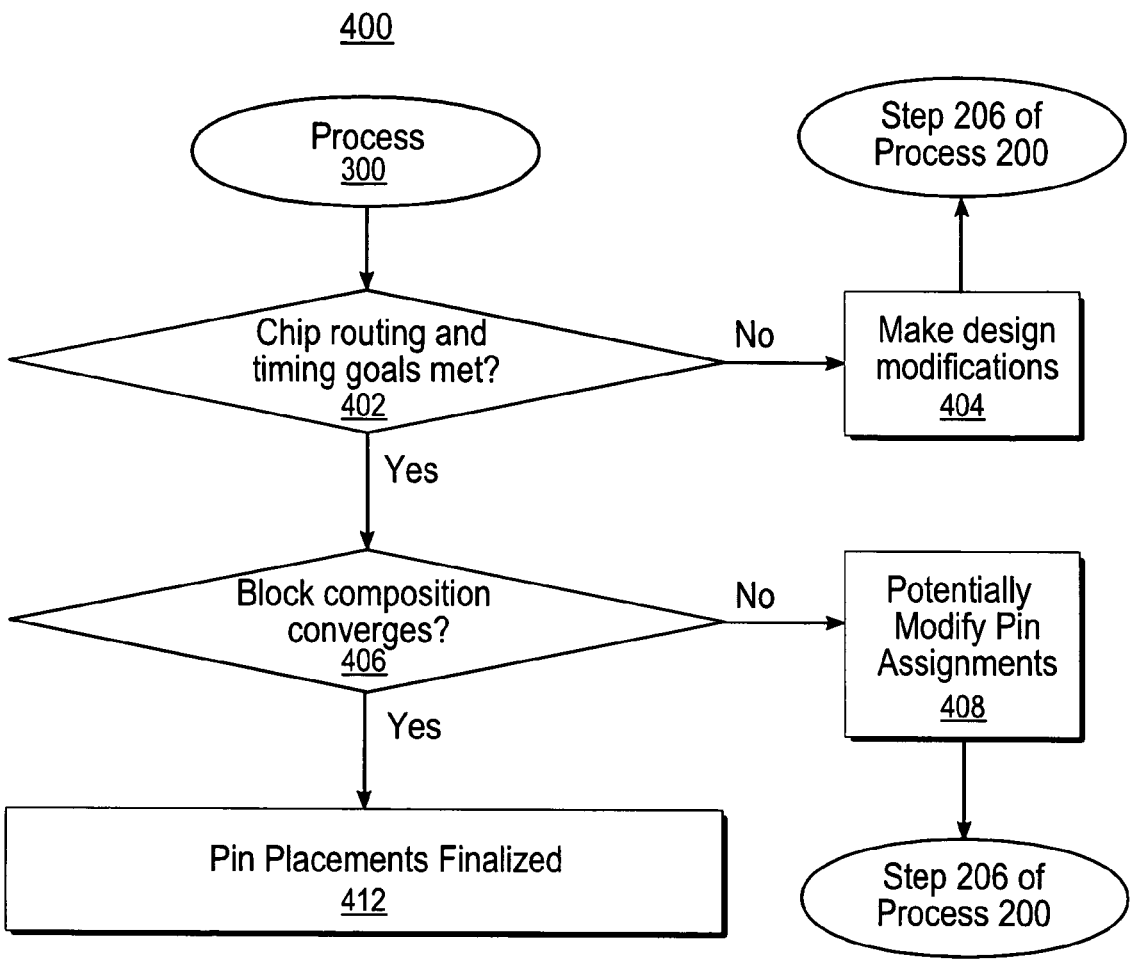
FIG. 4 is a flowchart of a process of refining pin assignments based on feedback, in accordance with an embodiment of the present invention.

Process Flow for Using Feedback to Refine Pin Assignments in an Integrated Circuit Design FIG. 4 illustrates steps of a process 400 of using feedback to refine pin assignments in an integrated circuit design, in accordance with an embodiment of the present invention. The feedback is from information learned in later stages of the design process. Process 400 may be executed after process 300. As discussed in the description of process 400, processes 200 and 300 may be executed again, after modifications made in view of information learned from process 400.

In step 402, pin assignments are evaluated, along with timing constraints, to determine whether both chip routing and chip timing goals are met. If either chip routing or chip timing goals are not met, then one or more modifications are made, in step 404.

The following are examples of modifications that might be made in step 404, though this list is not exhaustive. A modification can be made to the chip floorplan, such as changing block 102 placement or channel width. A modification can be made to the block 102 abstracts, such as modifying block 102 size, area, or aspect ratio. Modifications to abstracts can allow placing more pins on a certain edge of a block 102 to help provide more pin placements for timing critical interconnections. A modification can be made to a block 102 level design that will affect the block 102 level timing model. Examples of a block 102 level design modifications are removing or relocating logic and/or features within a block.

After step 404, if desired, new wire classes may be assigned to interconnections. Thus, optionally step 204 of process 200 may be performed again. Whether or not new wire classes are assigned, the interconnections may be re-routed. Thus, step 206 of process 200 may be performed again. Then, steps of process 300 may be performed again.

After chip routing and timing goals are met, step 406 is performed to ensure that the pin assignments allow the block composition to converge. Block composition refers to the how logic gates are implemented inside of a block 102 and how the logic gates interconnection. Since the pins interface with logic inside of a block 102, the pin placements affect whether the block composition converges. In other words, step 406 is used to determine whether the pin assignments are compatible with the design of the individual blocks 102. Determining whether the block composition converges may be accomplished with a commercial place and route tool.

If the block composition fails to converge, then a determination is made as to whether the pin assignments are the source of the problem. This determination may be made by a design engineer who is responsible for the block level design. If the pin assignments are not compatible with the block level design, the pin assignments are modified in step 408. Thus, step 206 of process 200 may be performed again to determine new interconnection routes for interconnections having new pin assignments. Then, steps of process 300 may be performed again.

If the block 102 composition converges, then pin assignment is complete, in step 412.

Hardware Overview

Figure 5:
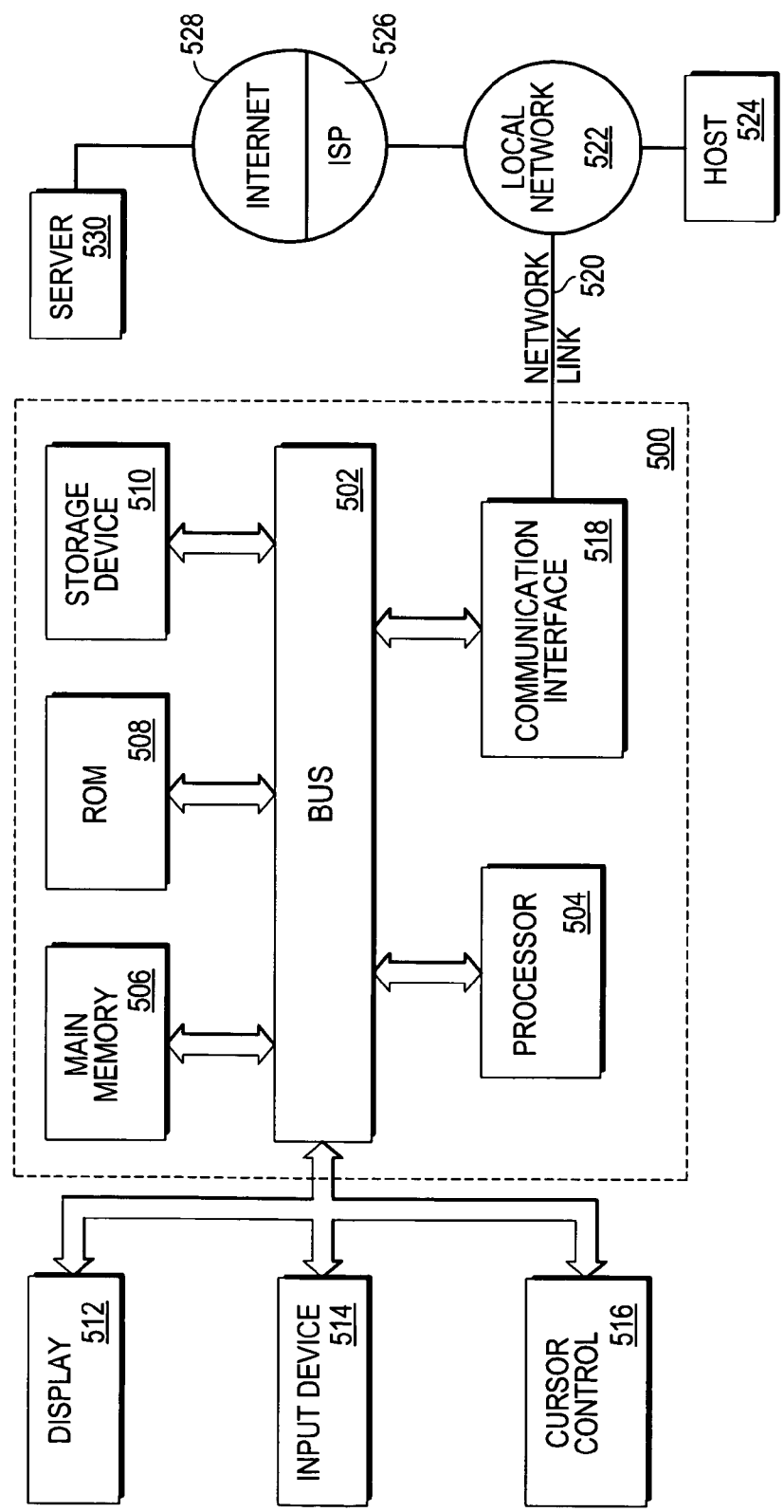
FIG. 5 is a diagram illustrating a computer system upon which an embodiment of the present invention may be practiced.

In one embodiment, steps of processes 200, 300, and 400 may take the form of sets of instructions that are executed by one or more processors. If they take the form of sets of instructions, FIG. 5 shows a block diagram of a computer system 500 upon which these sets of instructions may be executed. Computer system 500 includes a bus 502 for facilitating information exchange, and one or more processors 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions by processor 504. Computer system 500 may further include a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512 for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

In computer system 500, bus 502 may be any mechanism and/or medium that enables information, signals, data, etc., to be exchanged between the various components. For example, bus 502 may be a set of conductors that carries electrical signals. Bus 502 may also be a wireless medium (e.g. air) that carries wireless signals between one or more of the components. Bus 502 may further be a network connection that connects one or more of the components. Any mechanism and/or medium that enables information, signals, data, etc., to be exchanged between the various components may be used as bus 502.

Bus 502 may also be a combination of these mechanisms/media. For example, processor 504 may communicate with storage device 510 wirelessly. In such a case, the bus 502, from the standpoint of processor 504 and storage device 510, would be a wireless medium, such as air. Further, processor 504 may communicate with ROM 508 capacitively. Further, processor 504 may communicate with main memory 506 via a network connection. In this case, the bus 502 would be the network connection. Further, processor 504 may communicate with display 512 via a set of conductors. In this instance, the bus 502 would be the set of conductors. Thus, depending upon how the various components communicate with each other, bus 502 may take on different forms. Bus 502, as shown in FIG. 5, functionally represents all of the mechanisms and/or media that enable information, signals, data, etc., to be exchanged between the various components.

The invention is related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 500, various machine-readable media are involved, for example, in providing instructions to processor 504 for execution. Such a medium may take many forms, including but not limited to, non-volatile media, volatile media, and transmission media. Non-volatile median includes, for example, optical or magnetic disks, such as storage device 510. Volatile median includes dynamic memory, such as main memory 506. Transmission median includes coaxial cables, copper wire and fiber optics, including the wires that comprise bus 502. Transmission media can also take the form of acoustic or light waves, such as those generated during radio-wave and infra-red data communications.

Common forms of machine-readable median include, for example, a floppy disk, a flexible disk, hard disk, magnetic tape, or any other magnetic medium, a CD-ROM, DVD, or any other optical storage medium, punchcards, papertape, any other physical medium with patterns of holes, a RAM, a PROM, an EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution. In this manner, computer system 500 may obtain application code in the form of a carrier wave.

At this point, it should be noted that although the invention has been described with reference to specific embodiments, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims and the equivalents thereof.

What is claimed is:

1. A machine implemented method, said method comprising:
    accessing design information for an integrated circuit, wherein the design information includes a floorplan that sets forth an arrangement of a plurality of blocks in the integrated circuit and timing information for a plurality of interconnections between the blocks;
    assigning a wire class to each of the interconnections based on the timing information, wherein the wire class assigned to an interconnection consists of information specifying at least one of wire width, wire pitch, and wire routing layer preference to be used for that interconnection; and
    generating by using a machine, based at least partially on the wire class, route information for the interconnections between the blocks, wherein the route information includes physical pin placements for the interconnections.

2. The method of claim 1, further comprising:
    determining which interconnections have a timing violation; and
    changing the wire class for interconnections having a timing violation such that the interconnections no longer have a timing violation.

3. The method of claim 1, further comprising:
    determining which interconnections exceed a timing constraint for the respective interconnection by a threshold, and
    changing the wire class for interconnections that exceed the timing constraint by an amount that still allows the interconnections to satisfy the timing constraint.

4. The method of claim 1, further comprising:
    placing each of the interconnections into one of a plurality of bins based on a comparison of timing constraints for each particular interconnection with a timing arc for the particular interconnection; and
    wherein generating route information for the interconnections comprises applying a higher preference to interconnections in bins with interconnections having more critical timing constraints.

5. The method of claim 1, further comprising:
    evaluating the pin assignments to determine if chip level routing goals and chip timing goals are met;
    in response to determining that chip level routing goals and chip timing goals are not met, altering the design information to effect a change in the timing information;
    accessing the altered design information having the changed timing information; and
    generating, based at least partially on the changed timing information, route information for the interconnections between the blocks, wherein the route information includes physical routes and physical pin placements for the interconnections.

6. The method of claim 1, further comprising:
    determining whether the pin assignments are compatible with internal designs of the blocks;
    in response to determining the pin assignments are not compatible with internal designs of the blocks, altering the pin assignments; and
    based on the altered pin assignments, generating route information for the interconnections.

7. The method of claim 1, wherein the wire class assigned to an interconnection further includes information specifying one or more of the following: a distance between the interconnection and its neighbors; and a routing layer preference.

8. The method of claim 1, wherein the timing information is based, at least in part, on the floorplan.

9. The method of claim 1, wherein the timing information is based, at least in part, on internal timing information of the blocks.

10. The method of claim 1, wherein the timing information is based, at least in part, on projected locations for repeaters.

11. A machine readable storage medium having stored thereon a set of instructions which, when executed by one or more processors, causes the one or more processors to perform the following operations:

access design information for an integrated circuit, wherein the design information includes a floorplan that sets forth an arrangement of a plurality of blocks in the integrated circuit and timing information for a plurality of interconnections between the blocks;

assign a wire class to each of the interconnections based on the timing information, wherein the wire class assigned to an interconnection consists of information specifying at least one of wire width, wire pitch, and wire routing layer preference to be used for that interconnection; and generate, based at least partially on the timing information, route information for the interconnections between the blocks, wherein the route information includes physical pin placements for the interconnections.

12. The data storage device of claim 11, wherein the set of instructions further comprise instructions that when executed by the one or more processors, cause the one or more processors to perform the following operations:

determine which interconnections have a timing violation; and change the wire class for interconnections having a timing violation such that the interconnections no longer have a timing violation.

13. The data storage device of claim 11, wherein the set of instructions further comprise instructions that when executed by the one or more processors, cause the one or more processors to perform the following operations:

determine which interconnections exceed timing criteria by a threshold; and change the wire class for interconnections that exceed the timing constraint by an amount that still allows the interconnections to satisfy the timing constraint.

14. The data storage device of claim 11, wherein the set of instructions further comprise instructions that when executed by the one or more processors, cause the one or more processors to perform the following operation:

place each of the interconnections into one of a plurality of bins based on a comparison of timing constraints for each particular interconnection with a timing arc for the particular interconnection; and wherein the set of instructions that perform the operation of generating route information for the interconnections comprise a set of instructions that when executed by the one or more processors, cause the one or more processors to perform the following operation:

apply a higher preference to interconnections in bins with interconnections having more critical timing constraints.

15. The data storage device of claim 11, wherein the set of instructions further comprise instructions that when executed by the one or more processors, cause the one or more processors to perform the following operations:

evaluate the pin assignments to determine if chip level routing goals and chip timing goals are met;

in response to determining that chip level routing goals and chip timing goals are not met, alter the design information to effect a change in the timing information;

access the altered design information having the changed timing information; and generate, based at least partially on the changed timing information, route information for the interconnections between the blocks, wherein the route information includes physical routes and physical pin placements for the interconnections.

16. The data storage device of claim 11, wherein the set of instructions further comprise instructions that when executed by the one or more processors, cause the one or more processors to perform the following operations:

determine whether the pin assignments are compatible with internal designs of the blocks;

in response to determining the pin assignments are not compatible with internal designs of the blocks, alter the pin assignments; and based on the altered pin assignments, generate route information for the interconnections.

17. The data storage device of claim 11, wherein the wire class assigned to an interconnection further includes information specifying one or more of the following: a distance between the interconnection and its neighbors; and a routing layer preference.

18. The data storage device of claim 11, wherein the timing information is based, at least in part, on the floorplan.

19. The data storage device of claim 11, wherein the timing information is based, at least in part, on internal timing information of the blocks.

20. The data storage device of claim 11, wherein the timing information is based, at least in part, on projected locations for repeaters.

* * * * *

UNITED STATES PATENT AND TRADEMARK OFFICE
CERTIFICATE OF CORRECTION

PATENT NO. : 7,577,933 B1 Page 1 of 1
APPLICATION NO. : 11/601148
DATED : August 18, 2009
INVENTOR(S) : Yi Wu et al.

It is certified that error appears in the above-identified patent and that said Letters Patent is hereby corrected as shown below:

In Claim 11, Column 10 (line 66), please replace "machine readable storage medium" with --data storage device--.

Signed and Sealed this

Twentieth Day of October, 2009

David J. Kappos
*Director of the United States Patent and Trademark Office*